US008633686B1

(12) United States Patent
Sudhoff et al.

(10) Patent No.: US 8,633,686 B1
(45) Date of Patent: Jan. 21, 2014

(54) METHODS AND APPARATUS FOR CHARACTERIZING MAGNETIC PROPERTIES OF MATERIALS

(75) Inventors: Scott D. Sudhoff, West Lafayette, IN (US); James L. Cale, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 1339 days.

(21) Appl. No.: 11/807,196

(22) Filed: May 25, 2007

Related U.S. Application Data

(60) Provisional application No. 60/808,511, filed on May 25, 2006.

(51) Int. Cl.
 *G01R 33/14* (2006.01)
(52) U.S. Cl.
 USPC .......................................... 324/239; 324/223
(58) Field of Classification Search
 USPC ........................................ 324/222, 223, 239
 See application file for complete search history.

(56) References Cited

U.S. PATENT DOCUMENTS

| 2,711,509 A | * | 6/1955 | Endres et al. ................. 324/211 |
| 5,012,189 A |   | 4/1991 | Jiles |
| 5,479,099 A | * | 12/1995 | Jiles et al. ..................... 324/235 |

OTHER PUBLICATIONS

Accurately Modeling EI core Inductors Using a High-Fidelity Magnetic Equivalent Circuit Approach, Cale et al., IEEE Transactions on Magnetics, vol. 42, No. 1, Jan. 2006, pp. 40-46.*
Survey of Magnetic Core Models, Takach et al., IEEE, 0-7803-2482-X/95, 1995, pp. 560-566.*
Henrotte et al, An energy-based vector hysteresis model for ferromagnetic materials, Compel: The International Journal for Computation and Mathematics in Electrical and Electronic Engineering, vol. 25, No. 1, 2006, pp. 71-79.*
IEEE Standard for Test Procedures for Magnetic Cores, Mar. 10, 1992, 58 pages.
P.L. Chapman et al, "Dynamic Lossy Inductor Model for Power Converter Simulation," Seventeenth Annual IEEE Applied Power Electronics Conference and Exposition, vol. 1, pp. 137-143, Mar. 2002, Dallas, Texas.
T. Baynes, "Analysis of the Demagnetisation Process and Possible Alternative Magnetic Treatments for Naval Vessels," doctoral dissertation, The University of New South Wales, 2002, Ch. 5, pp. 150-179.

* cited by examiner

*Primary Examiner* — Jermele M Hollington
*Assistant Examiner* — David M. Schindler
(74) *Attorney, Agent, or Firm* — Maginot, Moore & Beck LLP

(57) ABSTRACT

Methods and apparatus for characterizing magnetic properties of materials, such as a material's anhysteretic B-H characteristic or its permeability as a function of B or H. A test apparatus for determining these magnetic properties is constructed to yield a symmetrical field distribution through material being tested to avoid localized saturation within the material. Characterization methods take into account radial variations in tangential field intensities when calculating the magnetic properties. The calculations are obtained as solutions of optimization problems through optimization methods such as genetic algorithms.

12 Claims, 7 Drawing Sheets

METHODS AND APPARATUS FOR CHARACTERIZING MAGNETIC PROPERTIES OF MATERIALS

CROSS-REFERENCE TO RELATED APPLICATION

This application claims the benefit of U.S. Provisional Patent Application Ser. No. 60/808,511, filed May 25, 2006, which application is hereby incorporated by reference along with all references cited therein.

GOVERNMENT RIGHTS

This invention was made with government support under Contract/Grant Nos. N00014-01-2-1099 and N00014-02-1-0623 awarded by the Office of Naval Research. The government has certain rights in the invention.

TECHNICAL FIELD OF THE INVENTION

The present invention relates generally to material science and, more particularly, to methods and apparatus for characterizing magnetic properties of materials.

BACKGROUND OF THE INVENTION

Material characteristics are clearly important to a variety of magnetic analyses. Examples include the finite element analysis of an induction machine or in the magnetic equivalent circuit analysis of a power inductor. It may be argued that, in the case of power applications such as electric machinery and power converter inductors, the reluctance of flux paths is dominated by the air portions of the path during unsaturated conditions. However, under saturated conditions this is no longer true and the magnetic properties of the material become important.

In the design of power components, the usual case is that at least a portion of the magnetic material is under some degree of saturation. Otherwise, a less massive and less expensive component could have been designed. Thus the saturated or at least partially saturated case is a relevant one for design. This is particularly true when applying automated design procedures using population based design algorithms. In this case, many of the designs in the population will be at saturated operating points. Saturated conditions are also often encountered during transient analyses. For example, in an induction machine start up, large inrush currents saturate the stator teeth.

Although material manufacturers generally supply magnetic characteristics of the material they provide, they do not always provide the information for highly saturated conditions or for specific temperatures of interest. For these reasons, as well as for the purpose of validation of supplied data, it is often desirable to measure the magnetic characteristics.

Two common procedures for obtaining magnetic characteristics are Vibrating Sample Magnetometry (VSM) and IEEE Std. 393-1991.

Obtaining magnetic measurements using VSM requires extensive laboratory equipment, including the magnetometer itself and instruments for sample preparation. In addition, magnetic characterization of highly permeable materials (in particular ferromagnetic and ferrimagnetic materials) using VSM can result in significant inaccuracy because the error in the demagnetization factor that results from deviation from an ideal geometry increases with increasing permeability of the sample.

Alternately, the IEEE Standard for Test Procedures for Magnetic Cores, Vol., Iss., 10 Mar. 1992, hereby incorporated by reference, (IEEE Std. 393-1991) is a simple and relatively inexpensive procedure for characterizing a magnetic material using a toroidal sample. Since the flux forms closed paths while remaining inside the material, it is not necessary to consider demagnetization factors.

In order to determine the magnetic characteristics of a material in accordance with IEEE Std. 393-1991, a toroidal geometry is used with a primary winding and secondary coil, as shown in FIG. 1. Therein, $r_i$ and $r_o$ denote the inner and outer toroid radii, respectively; $d_t$ denotes the depth of the toroid into the page. The number of turns of the primary (excitation coil) and secondary (search coil) windings are denoted $N_p$ and $N_s$, respectively. The primary voltage and current are denoted $v_p$ and $i_p$; the secondary voltage and current as $v_s$ and $i_s$.

An ac voltage waveform is applied to the primary winding, and $N_c$ cycles of the primary current and secondary voltage waveforms are recorded. It is assumed that the secondary voltage probe has extremely high impedance so that the secondary current is effectively zero.

After carefully removing dc offsets in the measured primary current and secondary coil voltage, the magnetizing flux linking the secondary winding is calculated from Faraday's law:

$$\lambda(t) = \int_0^t v_s(\tau)\,d\tau + \lambda(0) \tag{1}$$

Assuming there is no leakage flux, the flux density is uniformly distributed through the cross section of the material, and that the field intensity may be adequately determined by the mean path approximation, the field intensity and flux density is approximated as $$H = \frac{N_p i_p}{\pi(r_o + r_i)} \tag{2}$$

$$B = \frac{\lambda}{N_s d_t (r_o - r_i)} \tag{3}$$

In (2)-(3) B and H are assumed to be in the same (tangential) direction and thus vector notation is suppressed.

Two sources of error can result from the application of this procedure. First, the field intensity through a cross-section of the toroid is not uniformly distributed. Second, there is leakage flux associated with the primary winding, leading to distortions in the field distribution and localized saturation. Because of these effects, equation (3) underestimates the flux density produced by the coil. Both of these sources of error are accentuated during saturation.

SUMMARY OF THE INVENTION

One aspect of the present invention involves a test apparatus for determining magnetic properties of materials using ring-shaped material samples. The apparatus has a sample platform made of non-magnetic material with an aperture through it. The aperture is positioned for substantial alignment with the center of a ring-shaped sample placed on the platform. A conductor distribution assembly has a plurality of conductors extending laterally from the platform, in radial distribution to produce a symmetrical magnetic field through the sample during use. Each of the conductors have an inner segment passing through the aperture and extending substantially perpendicularly away from said platform, and a return segment positioned sufficiently remote to have negligible magnetic effect of the sample.

Another aspect of the present invention involves a method of calculating the anhysteretic B-H characteristic of a material utilizing primary and secondary coils wound around a material test sample. A range of electric current is introduced through the primary coil and the resulting secondary coil voltage is recorded over time. The measured magnetizing flux linkage and hysteresis loop for the sample is determined. A relationship is established between the measured magnetizing flux linkage and a predicted magnetizing flux linkage of the sample. The predicted magnetizing flux linkage incorporates spatial variation in the magnetic field intensity within the sample and has a plurality of parameters that capture anhysteretic magnetic properties of the material. Values of the parameters are determined that position a resulting fitted B-H characteristic curve within the measured hysteresis loop.

The objects and advantages of the present invention will be more apparent upon reading the following detailed description in conjunction with the accompanying drawings.

DETAILED DESCRIPTION OF PREFERRED EMBODIMENTS

Figure 1:
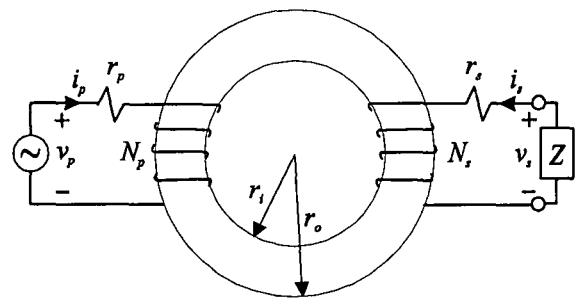
FIG. 1 shows the procedural setup used in IEEE Std. 393-1991.

For the purpose of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device and such further applications of the principles of the invention as illustrated therein being contemplated as would normally occur to one skilled in the art to which the invention relates.

Figure 2:
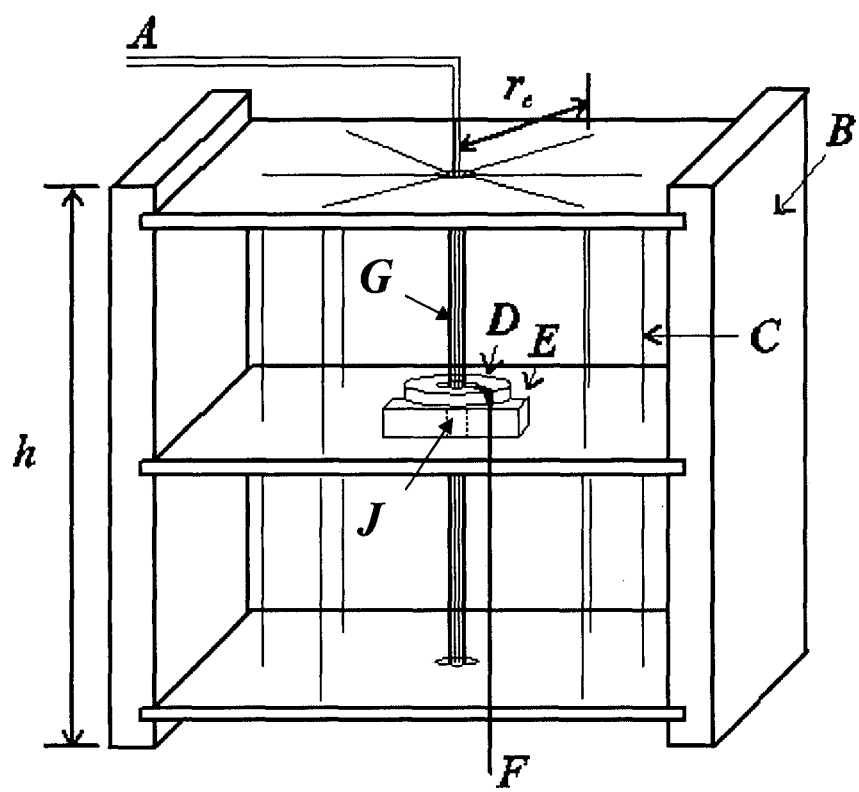
FIG. 2 is an isometric view of the preferred embodiment of a test apparatus for characterizing magnetic properties of materials, according to one aspect of the present invention.

One aspect of the present invention involves a test apparatus for characterizing magnetic properties of materials that avoids the errors previously described. FIG. 2 shows test apparatus B, a non-magnetic structure which is constructed for testing ring-shaped test samples, such as toroid-shaped magnetic cores. The test apparatus is designed to yield a symmetrical field distribution in which primary winding A does not cause localized saturation. In particular, it is desired to obtain the ideal tangentially directed field intensity given by $$H = \frac{N_p i_p}{2\pi r} \tag{4}$$

in the region of toroid-shaped sample D, where r is measured from the center of the toroid. The primary current $i_p$ is obtained from the number of inner segments G of the primary coils $N_p$ which pass through the center of toroid D and platform aperture J, and extend radially about its periphery through return path conductors C, so that as $N_p$ increases, the return current approximates a cylindrical current distribution. Toroid D shown in FIG. 2 is placed on a non-magnetic platform E, and is wrapped with secondary winding F.

Figure 3:
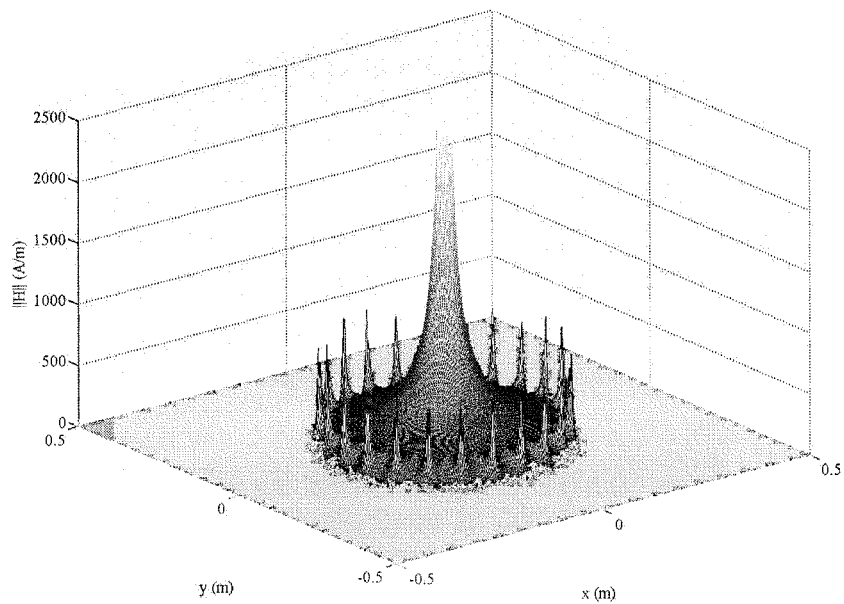
FIG. 3 shows magnitude of the field intensity $\|H\|$ produced by the primary windings in the apparatus of FIG. 1, in absence of test material.

Appropriate dimensions for test apparatus B may be chosen by calculating field intensity produced by the test apparatus with no material present, and then comparing it to field intensity produced by an ideal current density. In the absence of magnetic material, this may be readily computed using superposition of the field intensity due to each of the wire segments. For instance, FIG. 3 depicts the magnitude of the field intensity $\|H\|$ for test apparatus B with $i_p$=10 A. (In FIG. 3, the inside conductors are centered at the origin and the variation of the field in the z direction is neglected. The irregularity in the peaks is due to spatial aliasing of the plot.)

In actual tests, magnetic material is of course used. However, the symmetry of the sample (toroid D) is preferably chosen to match the symmetry of the field intensity produced by the test apparatus as calculated without the magnetic material.

In order to closely approximate the desired field distribution, the height h (FIG. 2) is preferably chosen to be much greater than the depth of the sample, and the radius of the current cylinder $r_c$ is preferably chosen to be much greater than the outer radius of the sample.

For example, wherein toroid D shown in FIG. 2 is a TX79/39/14 toroid made of FERROXCUBE 3C90 material available from FerroCube International Holdings, B.V., the dimensions of test apparatus B may be as shown in Table. 1. In this example, the height h was chosen to be 37 times greater than the toroid depth, and current cylinder radius $r_c$ was chosen to be 6 times greater than the outer radius of the toroid.

TABLE 1

DIMENSIONS FOR TEST STAND OF FIG. 2.

| Symbol | $r_c$ | h | $r_o$ | $r_i$ | $d_t$ |
|---|---|---|---|---|---|
| Dimension (mm) | 230.6 | 469.9 | 36.9 | 19.4 | 12.7 |

Figure 4:
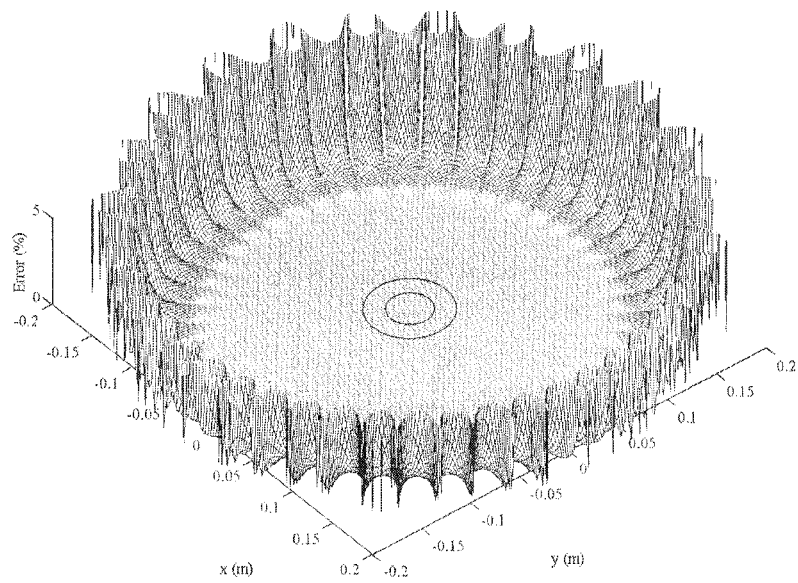
FIG. 4 shows percentage error from neglecting $\|H\|$ from the return conductors of the primary windings of FIG. 2.

The percentage error between the field intensity $\|H\|$ calculated as described and the ideal field intensity distribution of equation (4) is shown in FIG. 4. (The location of toroid D in FIG. 4 is outlined in the center of the plot.) The field intensity $\|H\|$ produced from return conductors C rapidly approaches zero with decreasing radial distance from the center of the current cylinder. The field intensity $\|H\|$ produced by return conductors C with a primary current $i_p$=10 A at a point $r_{avg}$=$(r_i+r_o)/2$ was calculated to be on the order of $10^{-14}$ (A/m); the magnitude $\|H\|$ from the inside conductors is on the order of $10^3$ (A/m). Therefore there is negligible error in assuming zero field intensity produced by return conductors C.

Figure 5:
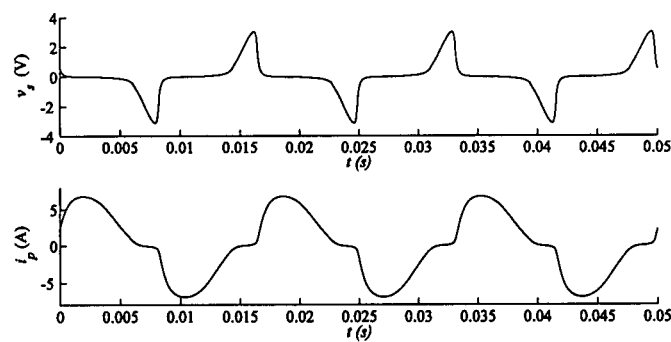
FIG. 5 shows measured secondary coil voltage and primary current applied to the toroid shown in FIG. 2.

Other than the use of test apparatus B, the experimental procedure used to characterize the magnetic properties of materials may be the same as IEEE Std. 393-1991. In this type of procedure, a current waveform is injected into primary winding A and the secondary voltage is captured and used to determine the flux linkage using equation (1). The secondary coil voltage and primary current measurements may be obtained from a digital acquisition system (DAS) with sampling time of 2 µs, for example. FIG. 5 shown a measured secondary coil voltage (secondary winding F consisted of 24 turns) and primary current (primary winding A also consisted of 24 turns) using this procedure with the toroid and test apparatus example mentioned above, and with a 60 Hz primary voltage.

Another aspect of the present invention involves methods of characterizing magnetic properties of materials that are obtained as solutions of optimization problems which take into account radial variations in field intensity within cross-sections of test samples used during the characterization procedures. One such characterization method is calculating the anhysteretic B-H characteristic of a material utilizing the secondary flux linkage and primary current.

Prior to posing the optimization problem for determining the anhysteretic B-H characteristic, an analytical form for the anhysteretic magnetization must first be defined. A commonly used approximation for the magnetization for H≥0 is the Frölich equation given by $$M(H) = \frac{\alpha H}{1 + \beta H} \quad (5)$$

where $\alpha/\beta$ is equal to the saturation magnetization. In order to provide additional degrees of freedom in capturing the magnetization characteristic, the following series form based on equation (5) may be used $$M(H) = sig(H) \sum_{k=1}^{K} \frac{m_k(|H|/b_k)^{n_k}}{1 + (|H|/b_k)^{n_k}} \quad (6)$$

where the sig(•) function is used to incorporate H<0. The parameters $m_k$, $b_k$, and $n_k$ may then be obtained by minimizing the error between the predicted and measured flux linkage as follows.

Using equations (4) and (6), the predicted secondary coil flux linkage $\hat{\lambda}(i_p)$ may be determined by applying Gauss' Law to the cross section of the toroid. This yields $$\hat{\lambda}(i_p) = \frac{\mu_0 d N_p N_s i_p}{2\pi} \left[ \ln\left(\frac{r_o}{r_i}\right) + \sum_{k=1}^{K} \frac{m_k}{b_k} \ln\left(\frac{2\pi r_o b_k + N_p|i_p|}{2\pi r_i b_k + N_p|i_p|}\right) \right] \quad (7)$$

In equation (7), d is the depth of the toroid.

In computing equation (7) from equation (6), it is necessary to choose $n_k$=1 ∀k. (This restriction on $n_k$ will be subsequently removed. The i in equation (7) refers to the primary current, and will refer to the primary current for the remainder of this description.)

Now that the expression for predicted flux linkage has been established, the optimization problem of establishing the anhysteretic B-H characteristic may now be posed. To this end, define the parameter vector to be determined as $$\theta = [m_1 \ldots m_K b_1 \ldots b_K] \quad (8)$$

The error associated with a set of parameters $\theta$ may defined as follows. First, the range of measured current is preferably divided into S intervals so that a normalized weighted error may be calculated to take into account the necessarily large error that occurs in the low current region. (In particular, the fact that the measured λ–i characteristic is not single-valued will cause error that would otherwise mask error in other portions of the λ–i characteristic.) The set of indices corresponding to the discrete current points in the s'th interval is then denoted as $K_s$, so that the error associated with the flux in the s'th interval $E_s(\theta)$ may then defined as $$E_s(\theta) = \frac{1}{|K_s|^{1/P} \lambda_{max}} \left( \sum_{j \in K_s} |\lambda_j - \hat{\lambda}_j|^P \right)^{1/P} \quad (9)$$

where $\lambda_{max}$ is the maximum flux and $|K_s|$ denotes the number of elements in $K_s$. The total normalized weighted error may then defined as $$E(\theta) = \sum_s w_s E_s(\theta) \bigg/ \sum_s w_s \quad (10)$$

where $w_s$ is the weighting factor associated with the s'th interval.

The number of intervals and weighting factors are determined by trial and error with the goal that the fitted curve is centered within the hysteresis loop of the measured characteristic. For instance, for the current shown in FIG. 5, P=5 and S=5 are used. The current ranges and weights for the s'th intervals are shown in Table 2.

TABLE 2

WEIGHTS FOR CURRENT INTERVALS USED IN EQUATION (10).

| s | $w_s$ | Current Interval |
|---|---|---|
| 1 | 1 | 0.25 < |i| ≤ 0.50 |
| 2 | 3 | 0.50 < |i| ≤ 0.75 |
| 3 | 9 | 0.75 < |i| ≤ 1.00 |

TABLE 2-continued

WEIGHTS FOR CURRENT INTERVALS
USED IN EQUATION (10).

| s | $w_s$ | Current Interval |
|---|---|---|
| 4 | 27 | $1.00 < |i| \leq 1.25$ |
| 5 | 81 | $|i| > 1.25$ |

Any optimization method, such as the Nelder-Mead or Newton-Raphson methods, can be used to minimize equation (10). The preferred optimization method is a genetic algorithm that requires the inclusion of a fitness function (to be maximized). The fitness for the parameter vector θ is defined as $$f(\theta) = \frac{1}{E(\theta) + \varepsilon} \quad (11)$$

where $\varepsilon$ is a small number ($10^{-10}$), introduced to avoid a singularity in the unlikely event of a perfect fit.

Details of determining the B-H characteristic of the FERROXCUBE 3C90 material mentioned above will be described here to demonstrate the method using the genetic algorithm.

Taking K=5 in equation (6), the minimum and maximum values for the parameter values were selected to be $$\theta_{mn} = \begin{bmatrix} \underbrace{1 \ 1 \ 1 \ 1 \ 1}_{m_k} & \underbrace{0 \ 0 \ 0 \ 0 \ 0}_{b_k} \end{bmatrix} \quad (12)$$

and $$\theta_{mx} = \begin{bmatrix} \underbrace{1 \cdot 10^6 \ 1 \cdot 10^6 \ 1 \cdot 10^6 \ 1 \cdot 10^6 \ 1 \cdot 10^6}_{m_k} & \underbrace{1 \ 1 \ 1 \ 1 \ 1}_{b_k} \end{bmatrix} \quad (13)$$

The genetic algorithm used was implemented in the MATLAB 7.0 brand numerical computing environment, available from MathWorks, Inc., and was part of the Genetic Optimization based System Engineering Tool (GOSET) toolbox, Ver. 2.01, from the School of Electrical and Computer Engineering, Purdue University, West Lafayette, Ind. The total number of individuals in the population and number of generations were taken to be $N_p$=1000 and $N_g$=250. It was observed that convergence was obtained in 50 generations.

Figure 6:
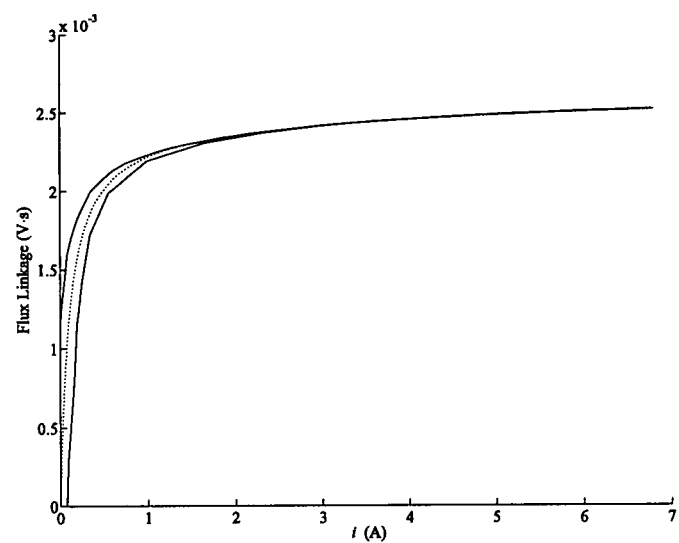
FIG. 6 shows the first quadrant of the fit to flux linkage: Measured λ (solid) vs. Fitted $\hat{\lambda}$ (dotted).

A plot of the fitted and measured λ–i characteristics using equation (7) after the fitting process is shown in FIG. 6. The optimization yielded the parameters shown in Table 3. The magnetic characterization of the material using equation (6) with the coefficients given in Table 3 and $n_k$=1 will be referred to as Characterization 1.

TABLE 3

PARAMETERS FOR M(H) USING EQUATION (6).

| k | 1 | 2 | 3 | 4 | 5 |
|---|---|---|---|---|---|
| $m_k (\times 10^5)$ | 0.7309 | 0.1598 | 3.1526 | 0.0001 | 0.0009 |
| $b_k$ | 0.3771 | 0.1683 | 0.3396 | 0.3396 | 0.0752 |

Figure 7:
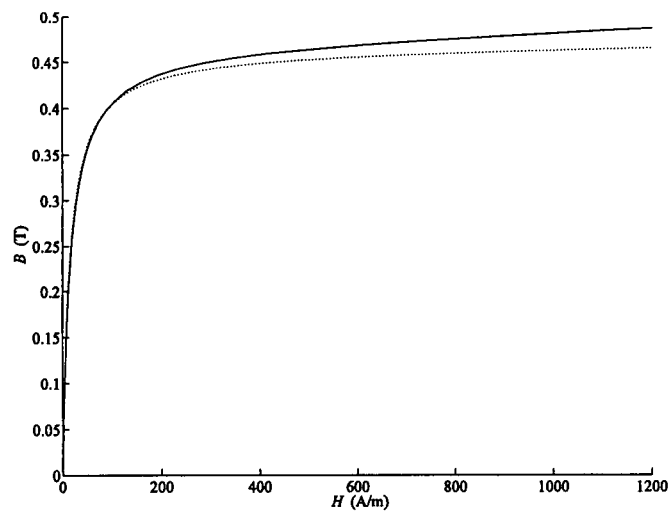
FIG. 7 compares the B-H characteristic obtained according to the first material characterization method of the present invention (solid) vs. that obtained by IEEE Std. 393-1991 (dotted).

The resulting B-H characteristic from Characterization 1 is compared to that obtained using the IEEE Std. 393-1991 in FIG. 7. As shown in FIG. 7, the B-H characteristics differ for large values of H (when the material is saturated).

Another method of characterizing magnetic properties of materials involves characterizing the material by its permeability as a function of B or H.

The permeability as a function of H is determined from the previously obtained B-H characteristic as follows. First, the magnetization is assumed to have the form in equation (6), but the $n_k$ are now allowed values other than one (this allows for flexibility, thereby reducing the number of required terms). The predicted $\hat{B}$ without the $n_k$=1 restriction is then fitted to the flux density obtained from the B-H characteristic.

From equation (6), where the absolute permeability as a function of field intensity is denoted $\mu_H(H)$, the absolute permeability may be expressed $$\mu_H(H) = \mu_0 \left( 1 + \sum_{k=1}^{K} \frac{m_k}{b_k} \frac{|H/b_k|^{n_k-1}}{1 + |H/b_k|^{n_k}} \right) \quad (14)$$

The parameter vector θ associated with equation (14) is defined as $$\theta = [m_1 \ldots m_J b_1 \ldots b_J n_1 \ldots n_J] \quad (15)$$

The error associated with the parameter vector θ is determined as follows. First, Characterization 1 is used to determine a set of points on the B-H characteristic. Let $H_j$ denote the j'th field intensity of interest and J denote the number of data points. The corresponding magnetization $M_j$ is calculated from equation (6), and finally the corresponding flux density $B_j = \mu_0 H_j + M_j$. Next for each $H_j$ the re-characterized flux density, denoted $\hat{B}_j$, is computed as $\mu_H(H_j) H_j$. The error is defined as $$E(\theta) = \frac{1}{J^{1/P} B_{max}} \left( \sum_{j=1}^{J} |B_j - \hat{B}_j|^P \right)^{1/P} \quad (16)$$

where $B_{max}$ is the flux density at the largest field intensity.

In order to minimize $E(\theta)$ any optimization method may be used, as previously mentioned. The preferred optimization method is, again, a genetic algorithm that requires the inclusion of a fitness function (to be maximized), such as equation (11), where $E(\theta)$ is given by equation (16).

Continuing from the demonstration above, taking P=5 and J=2 in equation (16), the minimum and maximum values for the parameter values may be selected to be $$\theta_{mn} = \begin{bmatrix} \underbrace{0.1 \ 0.1}_{n_k} & \underbrace{1 \ 1}_{m_k} & \underbrace{1 \ 1}_{b_k} \end{bmatrix} \quad (17)$$

and $$\theta_{mx} = \begin{bmatrix} \underbrace{1.5 \ 5}_{n_k} & \underbrace{5 \cdot 10^6 \ 5 \cdot 10^6}_{m_k} & \underbrace{1 \cdot 10^4 \ 1 \cdot 10^4}_{b_k} \end{bmatrix} \quad (18)$$

The total number of individuals in the population and number of generations may be taken to be $N_p$=1000 and $N_g$=5000. Convergence was obtained in approximately 2000 generations with a final fitness of $8.3 \times 10^5$. The resulting parameters are shown in Table 4. The characterization of the permeability using equation (14) with the parameters in Table 4 will be referred to as Characterization 2.

TABLE 4

PARAMETERS FOR $\mu_H(H)$ IN EQUATION(14).

| k | $m_k$ (×10$^5$) | $b_k$ (×10$^2$) | $n_k$ |
|---|---|---|---|
| 1 | 3.3268 | 0.1027 | 0.9856 |
| 2 | 0.7790 | 3.5471 | 0.7339 |

Figure 8:
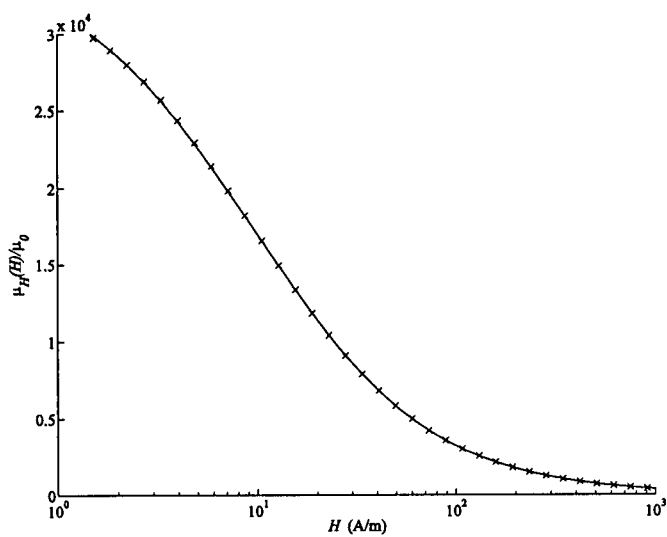
FIG. 8 compares relative permeability as a function of H using the first (solid) and second (x'd) material characterization methods of the present invention.
Figure 9:
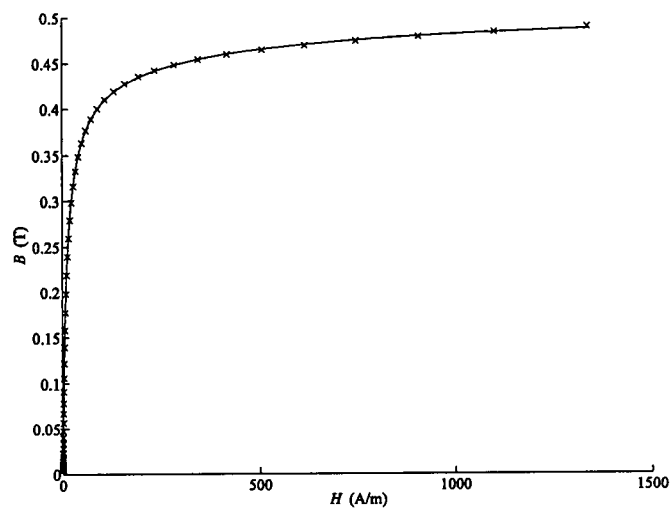
FIG. 9 compares the B-H characteristic obtained using the first (solid) and second (x'd) material characterization method of the present invention.

The relative permeability $\mu_H(H)/\mu_0$, based on Characterization 2 is compared to that of Characterization 1 in FIG. 8. The corresponding B-H characteristics using the two characterizations is shown in FIG. 9. Clearly, the characterizations are effectively equivalent. However, allowing $n_k \neq 1$ in equation (6) allows fewer terms to be used.

The absolute permeability as a function of flux density will be denoted $\mu_B(B)$. In determining an analytic form for $\mu_B(B)$ it is desired that the permeability be such that for small values of $|B|$, $B=\mu_{lin}H$, where $\mu_{lin}$ is the permeability in the linear region. In addition, for large values of $|B|$, it is desired that the functional form approaches $B=\mu_0(H+M_{sat})$. The following function has both of these properties:

$$\mu_B(B) = \mu_0 \frac{\frac{1}{K}\sum_{k=1}^{K}\left(\left|\frac{B}{m_k}\right|^{n_k} + a_k^{n_k}\right)^{\frac{1}{n_k}}}{\frac{1}{K}\sum_{k=1}^{K}\left(\left|\frac{B}{m_k}\right|^{n_k} + a_k^{n_k}\right)^{\frac{1}{n_k}} - 1} \quad (19)$$

For purposes of fitting, a parameter $\mu_{r,k}$ is also defined such that $a_K = \mu_{r,k}/(\mu_{r,k}-1)$ Considering the case in which K=1, it can be readily shown that equation (19) reduces to $B=\mu_0\mu_{r,1}H$ for small values of $|B|$ and to $B=\mu_0H+m_1$ for large values of $|B|$.

The parameter vector $\theta$ is defined as $$\theta = [\mu_{r1} \ldots \mu_{rK} n_1 \ldots n_K m_1 \ldots m_K] \quad (20)$$

and the error function $E(\theta)$ is the same as that given in equation (15). In order to minimize $E(\theta)$ a genetic algorithm was used. This required the inclusion of a fitness function (to be maximized). The total fitness for the parameter vector $\theta$ is the same as that given in equation (11).

Continuing the demonstration from above, take K=5 in equation (19), and the minimum and maximum values for the parameter values may be selected to be $$\theta_{mn} = \left[\frac{5\cdot 10^3 \quad 5\cdot 10^3 \quad 5\cdot 10^3 \quad 5\cdot 10^3 \quad 5\cdot 10^3 \quad \ldots}{\mu_{rk}}\right. \quad (21)$$

$$\left.\frac{1 \quad 1 \quad 1 \quad 1 \quad 1}{n_k} \quad \frac{1^{-2} \quad 1^{-2} \quad 1^{-2} \quad 1^{-2} \quad 1^{-2}}{m_k}\right]$$

and $$\theta_{mx} = \left[\frac{10^6 \quad 10^6 \quad 10^{10} \quad 10^6 \quad 10^6 \quad \ldots}{\mu_{rk}}\right. \quad (22)$$

$$\left.\frac{10^2 \quad 10^2 \quad 10^2 \quad 10^2 \quad 10^2}{n_k} \quad \frac{5 \quad 5 \quad 5 \quad 5 \quad 5}{m_k}\right]$$

The total number of individuals in the population and number of generations may be taken to be $N_p=1000$ and $N_g=1000$. Convergence was consistently obtained in 350 generations with a fitness of $3.2\times10^2$. The results of the fitting process yielded the parameters shown in Table 5.

TABLE 5

PARAMETERS FOR $\mu_B(B)$ IN EQUATION (19).

| k | 1 | 2 | 3 | 4 | 5 |
|---|---|---|---|---|---|
| $\mu_{r,k}$ (×10$^7$) | 0.0012 | 0.0025 | 1.2069 | 0.0278 | 0.0011 |
| $n_k$ | 5.2914 | 4.3428 | 5.2269 | 23.7188 | 20.7832 |
| $m_k$ | 2.5005 | 1.4034 | 2.8362 | 0.5079 | 0.6574 |

Figure 10:
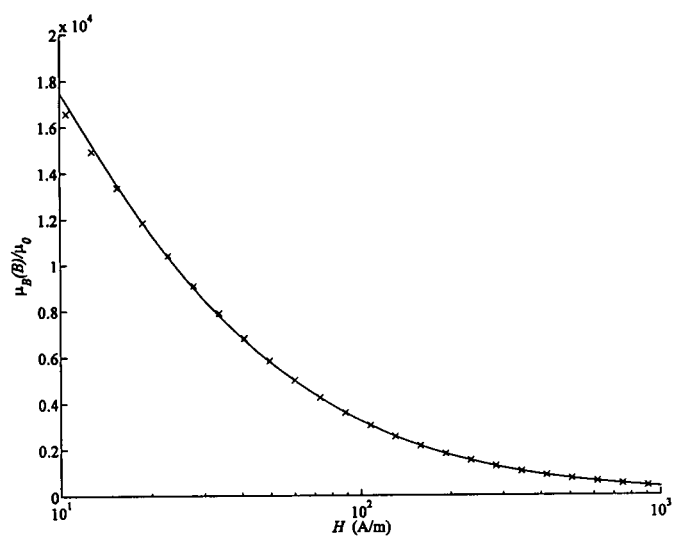
FIG. 10 compares relative permeability as a function of B obtained using the first (solid) and third (x'd) material characterization methods of the present invention.
Figure 11:
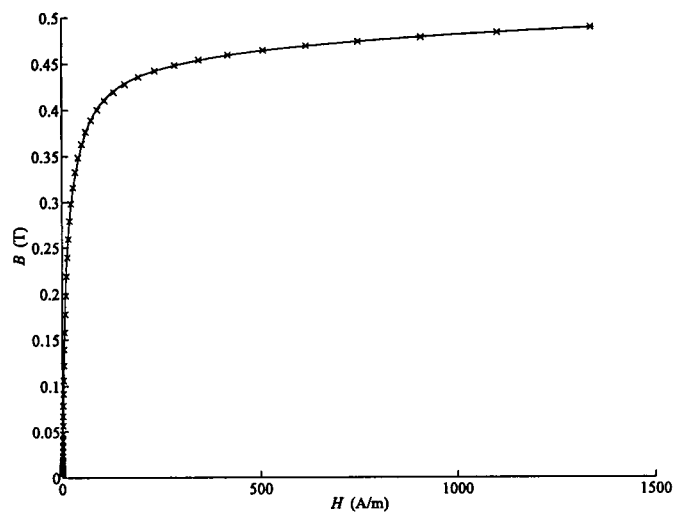
FIG. 11 compares the B-H characteristic obtained using the first (solid) and third (x'd) characterization methods of the present invention.

The characterization of the magnetic characteristics using equation (19) with the parameters in Table 5 will be referred to as Characterization 3. The relative permeability $\mu_B(B)/\mu_0$ using Characterization 3 is shown and compared to that of Characterization 1 in FIG. 10. The corresponding B-H characteristics are shown in FIG. 11.

A VSM measurement of the predicted saturation of the material used in the previous demonstrations described above was taken for comparison with results obtained with the methods and apparatus of the present invention, as well as with IEEE Std. 393-1991. From equation (6), the theoretical saturation magnetization may be expressed $$M_s = \sum_{k=1}^{K} m_k \quad (23)$$

The predicted saturation magnetizations using the characterization method of the present invention and that obtained from IEEE Std 393-1991 are shown in Table 6, along with the maximum magnetization obtained with the VSM measurement.

TABLE 6

SATURATION MAGNETIZATIONS.

| Test Procedure | $M_s$ (×10$^2$) (A/m) |
|---|---|
| IEEE Std 393-1991 | 3.7390 |
| New Procedure | 4.1058 |
| VSM | ≥3.9708 |

Figure 12:
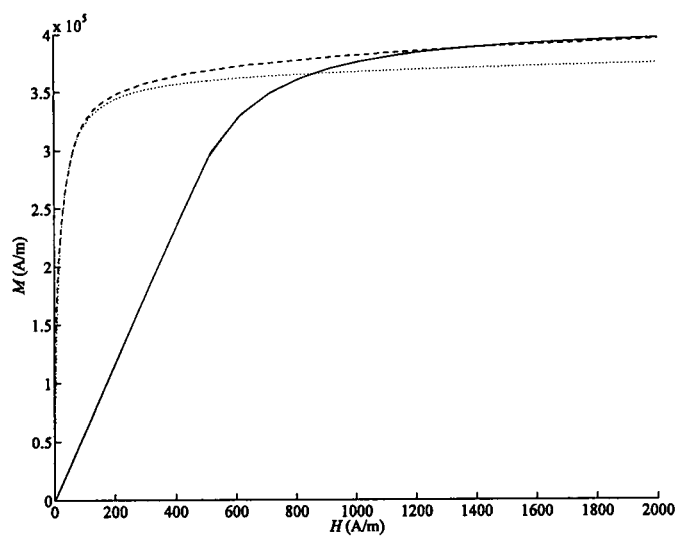
FIG. 12 compares predicted magnetization curves using a characterization method according to the present invention (dashed), IEEE Std. 393-1991 (dotted), and VSM measurement (solid).

The magnetization curves predicted using the methods and apparatus of the present invention, IEEE Std 393-1991, and VSM measurement are shown in FIG. 12. Because of the demagnetization field (which was unknown in this case since the sample was irregular) the magnetization curve obtained from the VSM measurement is sheared to the right. However, as shown in Table 6 and FIG. 12, the procedure in IEEE Std 393-1991 results in an underestimation of the saturation magnetization, whereas the procedure set forth herein gives the value consistent with the VSM measurement.

Figure 13:
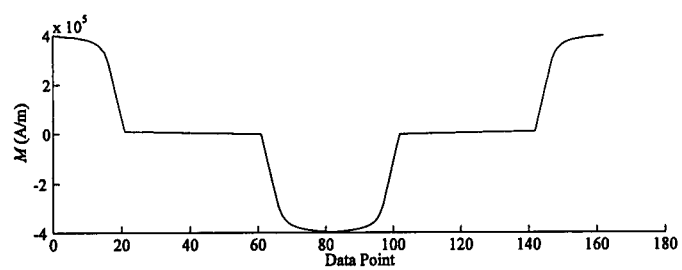
FIG. 13 shows magnetization values obtained from VSM.

The values of magnetization obtained from the VSM measurement are plotted in FIG. 13. Therein, each data point corresponds to a different value of H. Note that the sample became close to, but not completely, saturated. Thus the prediction of $M_s=4.1058\times10^5$ (A/m) using the method and apparatus of the present invention, which assumed $H \rightarrow \infty$, is a reasonable estimate to the true value of saturation magnetization.

A case study demonstrating the importance of improved magnetic characterizations of materials is included in the article entitled "An improved Magnetic Characterization Method for Highly Permeable Materials", hereby incorporated by reference, by J. Cale, S. D. Sudhoff and J. Turner, Magnetics, IEEE Transactions on, vol. 42, no. 8, pp. 1974-1981, August 2006.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A method of determining an anhysteretic B-H characteristic of a material utilizing a primary coil and a secondary coil wound around a test sample of the material, comprising:
    holding the test sample in a test fixture with the primary coil and the secondary coil wound around the test sample;
    introducing a range of electric current through the primary coil and electronically recording the primary coil current and resulting secondary coil voltage over time;
    determining a measured magnetizing flux linkage versus primary coil current characteristic values for the sample from the recorded primary coil current and secondary coil voltage;
    establishing an expression for predicted magnetizing flux linkage incorporating spatial variation in the magnetic field intensity within the sample and based in part on anhysteretic magnetic properties of the material; and
    utilizing said expression to obtain values of characterizing parameters that cause a curve to fit within said measured magnetizing flux linkage versus primary coil current characteristic values, wherein said anhysteretic B-H characteristic is defined by said characterizing parameter values.

2. The method of claim 1, wherein determination of said values of said characterizing parameters comprises obtaining a solution of an optimization problem.

3. The method of claim 2, wherein a genetic algorithm is used in the solution of said optimization problem.

4. The method of claim 3, wherein said range of electric current is divided into weighted intervals to minimize error in said solution.

5. The method of claim 1, wherein the material test sample is ring-shaped, said method further comprising:
    placing the ring-shaped sample on a non-magnetic platform having an aperture therethrough defining an axis, with the ring-shaped sample substantially coaxial with said aperture; and
    arranging said primary coil with respect to the ring-shaped sample so as to produce a substantially symmetrical magnetic field distribution for the sample without localized saturation from said primary coil.

6. The method of claim 5, wherein said primary coil has a plurality of conductors having parallel inner and outer segments and interconnecting radial segments, said inner segments extending along said axis through said aperture and the ring-shaped sample, said parallel outer segments having substantially equiangular spacing.

7. The method of claim 6, wherein the current through said outer segments approximates a cylindrical current distribution.

8. The method of claim 6, wherein said outer segments are sufficiently spaced apart from the test sample to have a negligible magnetic effect thereon.

9. The method of claim 8, wherein an axial dimension of said inner segments is much greater than that of the sample, and said outer segments have a radial spacing from said axis that is much greater than the outer radius of the sample.

10. The method of claim 9, wherein the axial dimension of said inner segments is more than 30 times that of the sample, and the radial spacing of said outer segments from said axis is more than 5 times the outer radius of the sample.

11. The method of claim 1, wherein the determining step further comprises determining said measured magnetizing flux linkage versus primary coil current characteristic value for a hysteresis loop for the sample from the recorded primary coil current and secondary coil voltage.

12. The method of claim 4, wherein the material test sample is toroid-shaped and said expression for predicted magnetizing flux linkage is $$\hat{\lambda}(i_p) = \frac{\mu_0 d N_p N_s i_p}{2\pi} \left[ \ln\left(\frac{r_o}{r_i}\right) + \sum_{k=1}^{K} \frac{m_k}{b_k} \ln\left(\frac{2\pi r_o b_k + N_p |i_p|}{2\pi r_i b_k + N_p |i_p|}\right) \right]$$

where $\hat{\lambda}(i_p)$ is the predicted magnetizing flux linkage of the material, $\mu_0$ is the permeability of free space, d is the depth of the toroid, $N_p$ is the number of turns of the primary coil, $N_s$ is the number of turns of the secondary coil, $i_p$ is the current of the primary coil, $r_o$ is the outer radius of the toroid, $r_i$ is the inner radius of the toroid, K is a number of terms used to represent the anhysteretic characteristic of the material, and $m_k$ and $b_k$ are said characterizing parameters.

* * * * *